United States Patent
Takai et al.

(10) Patent No.: US 7,880,256 B2
(45) Date of Patent: Feb. 1, 2011

(54) SEMICONDUCTOR DEVICE WITH PASSIVATION LAYER COVERING WIRING LAYER

(75) Inventors: Nobuyuki Takai, Kumagaya (JP); Takuya Suzuki, Kazo (JP); Yuji Tsukada, Ora-gun (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 704 days.

(21) Appl. No.: 11/386,106

(22) Filed: Mar. 22, 2006

(65) Prior Publication Data

US 2006/0249845 A1 Nov. 9, 2006

(30) Foreign Application Priority Data

Mar. 25, 2005 (JP) .............................. 2005-087685
Feb. 22, 2006 (JP) .............................. 2006-045448

(51) Int. Cl.
H01L 29/40 (2006.01)
H01L 21/4763 (2006.01)
H01L 21/70 (2006.01)

(52) U.S. Cl. ........................ 257/437; 257/383; 257/758; 257/760

(58) Field of Classification Search ................. 257/383, 257/437, 758

See application file for complete search history.

(56) References Cited

U.S. PATENT DOCUMENTS

| | | | | | |
|---|---|---|---|---|---|
| 4,733,289 | A | * | 3/1988 | Tsurumaru | .................. 257/640 |
| 4,878,105 | A | * | 10/1989 | Hirakawa et al. | ........... 257/754 |
| 6,483,162 | B2 | * | 11/2002 | Kwon et al. | ................. 257/437 |
| 6,514,852 | B2 | * | 2/2003 | Usami | ......................... 438/624 |
| 6,617,674 | B2 | * | 9/2003 | Becker et al. | ............... 257/678 |
| 6,723,628 | B2 | | 4/2004 | Matsumoto et al. | |
| 6,790,759 | B1 | * | 9/2004 | Wang et al. | ................. 438/612 |
| 7,416,971 | B2 | * | 8/2008 | Lin et al. | .................... 438/618 |
| 2003/0049923 | A1 | * | 3/2003 | Smoak | ....................... 438/612 |
| 2004/0201105 | A1 | * | 10/2004 | Narizuka et al. | ............ 257/762 |
| 2005/0017361 | A1 | * | 1/2005 | Lin et al. | .................... 257/756 |
| 2006/0192289 | A1 | * | 8/2006 | Drexl et al. | ................. 257/758 |

FOREIGN PATENT DOCUMENTS

JP 2004-158678 6/2004

* cited by examiner

Primary Examiner—Matthew C Landau
Assistant Examiner—James M Mitchell
(74) Attorney, Agent, or Firm—Morrison & Foerster LLP

(57) ABSTRACT

The invention provides a semiconductor device with a bonding pad made of a wiring layer including aluminum and its manufacturing method that enhance the yield of the semiconductor device. The method of manufacturing the semiconductor device of the invention includes removing a portion of an antireflection layer (e.g. made of a titanium alloy) formed on an uppermost second wiring layer (e.g. made of aluminum) on a semiconductor substrate by etching, forming a passivation layer covering the antireflection layer and a portion of the second wiring layer where the antireflection layer is not formed and having an opening exposing the other portion of the second wiring layer, and dividing the semiconductor substrate into a plurality of semiconductor dice by dicing. These processes can prevent the antireflection layer from being exposed in the opening, and this can prevent a component of the second wiring layer from being eluted due to cell reaction between the second wiring layer and the antireflection layer as has been seen in the conventional art.

5 Claims, 16 Drawing Sheets

… (1)

SEMICONDUCTOR DEVICE WITH PASSIVATION LAYER COVERING WIRING LAYER

CROSS-REFERENCE OF THE INVENTION

This invention is based on Japanese Patent Application No. 2005-087685 and No. 2006-045448, the content of which is incorporated herein by reference in its entirety.

BACKGROUND OF THE INVENTION

1. Field of the Invention

The invention relates to a semiconductor device and its manufacturing method, particularly, a semiconductor device with a bonding pad made of a wiring layer including aluminum and its manufacturing method.

2. Description of the Related Art

A bonding pad has been known as an electrode for external connection of an input/output terminal or a power supply terminal of a semiconductor integrated circuit or the like. The bonding pad is formed using an aluminum (Al) wiring, for example, and connected with a lead frame or the like through a bonding wire or the like.

Next, a conventional semiconductor device with the bonding pad made of an aluminum (Al) wiring will be described referring to figures. FIG. 40 is a cross-sectional view showing the conventional semiconductor device and its manufacturing method. This semiconductor device has a multi-layered wiring structure.

A transistor 10T is formed on a semiconductor substrate 10 (to be a semiconductor die) as shown in FIG. 40. That is, a gate insulation film 11 and a gate electrode 12 are formed on the semiconductor substrate 10, and a source 13 and a drain 13 are formed on each side thereof, forming the transistor 10T.

A first interlayer insulation film 14 made of, for example, a silicon oxide film ($SiO_2$) is formed on this semiconductor substrate 10, contact holes are formed by etching or the like, corresponding to the source 13 and the drain 13 of the transistor 10T, and first plugs 15 are embedded therein respectively. Furthermore, a first barrier layer 16 made of titanium (Ti) and titanium nitride (TiN) layered in this order is formed on the first interlayer insulation film 14. A first wiring layer 17 made of aluminum (Al) is deposited on this first barrier layer 16 by, for example, a sputtering method, being formed into a predetermined pattern. The source 13 and the drain 13 of the transistor 10T and the first wiring layer 17 are electrically connected through the first plugs 15 respectively.

Furthermore, a second barrier layer 18 which is the same as the first barrier layer 16 is formed on the first wiring layer 17. These first barrier layer 16, first wiring layer 17, and second barrier layer 18 are formed into a predetermined pattern. Then, a second interlayer insulation film 19 which is the same as the first interlayer insulation film 14 is formed on the second barrier layer 18. A contact hole is formed in the second interlayer insulation film 19 according to needs, and a second plug 20 is embedded therein. The second plug electrically connects the first wiring layer 17 with a second wiring layer 22 which will be described below.

Furthermore, a third barrier layer 21 which is the same as the first barrier layer 16 is formed on the second interlayer insulation film 19, and the second wiring layer 22 made of aluminum (Al) is deposited thereon by, for example, a sputtering method. An antireflection layer 53 made of, for example, titanium nitride (TiN) is formed on the second wiring layer 22. Then, patterning is performed to the third barrier layer 21, the second wiring layer 22, and the antireflection layer 53. In this patterning, reflection of exposure to a photoresist (not shown) used as a mask for the patterning can be prevented by the antireflection layer 53. Thus, the exposure and development of the photoresist can be performed with high precision, and thus the patterning of the second wiring layer 22 can be performed with high precision.

Next, a passivation layer 55 covering the second wiring layer 22 and the antireflection layer 53 is formed. Then, the antireflection layer 53 and the passivation layer 55 are etched so as to form an opening 54 exposing the second wiring layer 22. The second wiring layer 22 exposed in this opening 54 is to be a bonding pad which is to be formed with a bonding wire 56 connecting the second wiring layer 22 with a lead frame (not shown).

The relevant technology is described in Japanese Patent Application Publication No. 2004-158678.

FIGS. 41A and 41B are cross-sectional views showing a step of the process of manufacturing the semiconductor device shown in FIG. 40 or the completed semiconductor device, showing a portion near the uppermost layer. The bonding wire 56 is omitted in FIGS. 41A and 41B.

As shown in FIG. 41A, an end portion of the antireflection layer 53 formed on the second wiring layer 22 is exposed in the opening 54 of the passivation layer 55. When moisture 30 containing impurities, that is, moisture used in the semiconductor manufacturing process or moisture in the air reaches these second wiring layer 22 and antireflection layer 53, a defect portion 22H occurs in the second wiring layer 22 due to its eluted aluminum (Al) component, and an eluted component 22F is deposited on the surface of the exposed second wiring layer 22, as shown in FIG. 41B.

This problem occurs since the moisture 30 containing impurities that adheres to the second wiring layer 22 and the antireflection layer 53 functions as an electrolyte to cause cell reaction between the aluminum (Al) component of the second wiring layer 22 and the titanium (Ti) component of the antireflection layer 53. Since the ionization tendency of titanium (Ti) is lower than the ionization tendency of aluminum (Al) in the cell reaction, aluminum (Al) ions move more than titanium (Ti) ions and thus aluminum is eluted.

As a result, a connection failure occurs between the second wiring layer 22 as the bonding pad and the lead frame (not shown) when a wire is bonded thereto, reducing the yield of the semiconductor device.

SUMMARY OF THE INVENTION

The invention provides a semiconductor device with a bonding pad made of a wiring layer including aluminum and its manufacturing method that enhance the yield of the semiconductor device.

The invention provides a semiconductor device including: a semiconductor die; a wiring layer formed on the semiconductor die; an antireflection layer formed on a portion of the wiring layer; and a passivation layer covering the wiring layer and the antireflection layer, wherein the passivation layer has an opening exposing a portion of the wiring layer and not exposing an end portion of the antireflection layer.

The invention also provides a semiconductor device including: a semiconductor die; a wiring layer formed on the semiconductor die; and a passivation layer covering the wiring layer, wherein the passivation layer is formed so as to have an opening exposing a portion of the wiring layer and directly contact the wiring layer that is not exposed.

The invention also provides a semiconductor device including: a semiconductor die; a wiring layer formed on the semiconductor die; an antireflection layer formed on a portion of the wiring layer; and a passivation layer covering the wiring layer and the antireflection layer, wherein the passivation layer exposes an end portion of the antireflection layer and the end portion of the antireflection layer is covered with a metal layer.

The invention also provides a method of manufacturing a semiconductor device including: forming a wiring layer and an antireflection layer on a semiconductor substrate and patterning these layers; removing a portion of the antireflection layer by etching; forming a passivation layer covering the wiring layer and the antireflection layer; and exposing a portion of the wiring layer where the antireflection layer is not formed, and removing a portion of the passivation layer by etching so as not to expose an end portion of the antireflection layer.

The invention also provides a method of manufacturing a semiconductor device including: forming a wiring layer and an antireflection layer on a semiconductor substrate and patterning these layers; removing the whole antireflection layer by etching; forming a passivation layer so as to directly contact the wiring layer; and removing a portion of the passivation layer by etching so as to expose a portion of the wiring layer.

The invention also provides a method of manufacturing a semiconductor device including: forming a wiring layer and an antireflection layer on a semiconductor substrate and patterning these layers; forming a first passivation layer so as to cover the wiring layer and the antireflection layer; removing a portion of the antireflection layer and a portion of the first passivation layer by etching so as to expose a portion of the wiring layer; forming a second passivation layer so as to cover the wiring layer and the first passivation layer; and removing the second passivation layer by etching so as to expose a portion of the wiring layer again.

In this method, the removing of the second passivation layer is performed by a sputter etching.

The invention also provides a method of manufacturing a semiconductor device including: forming a wiring layer and an antireflection layer on a semiconductor substrate and patterning these layers; forming a passivation layer so as to cover the wiring layer and the antireflection layer; removing a portion of the antireflection layer and a portion of the passivation layer by etching so as to expose a portion of the wiring layer to form an opening exposing an end portion of the antireflection layer, and forming a metal layer so as to cover the end portion of the antireflection layer.

The invention also provides a method of manufacturing a semiconductor device including: forming a wiring layer and an antireflection layer on a semiconductor substrate; removing a portion of the antireflection layer by etching; forming a passivation layer covering the wiring layer and the antireflection layer; and removing a portion of the passivation layer by etching so as to expose a portion of the wiring layer where the antireflection layer is not formed and so as not to expose an end portion of the antireflection layer.

The invention can prevent metal that forms the wiring layer from being eluted to form a defect portion or deposit an eluted component. Therefore, when a wire is bonded to the wiring layer, a connection failure as has been seen in the conventional art can be prevented. As a result, the yield can be increased by this semiconductor device with the bonding pad made of a wiring layer including aluminum and its manufacturing method.

DETAILED DESCRIPTION OF THE INVENTION

A semiconductor device of the first embodiment of the invention will be described referring to figures. FIGS. 1 to 4 are cross-sectional views showing a method of manufacturing the semiconductor device of this embodiment. FIG. 5 is a cross-sectional view showing the semiconductor device and its manufacturing method of this embodiment.

Figure 40:
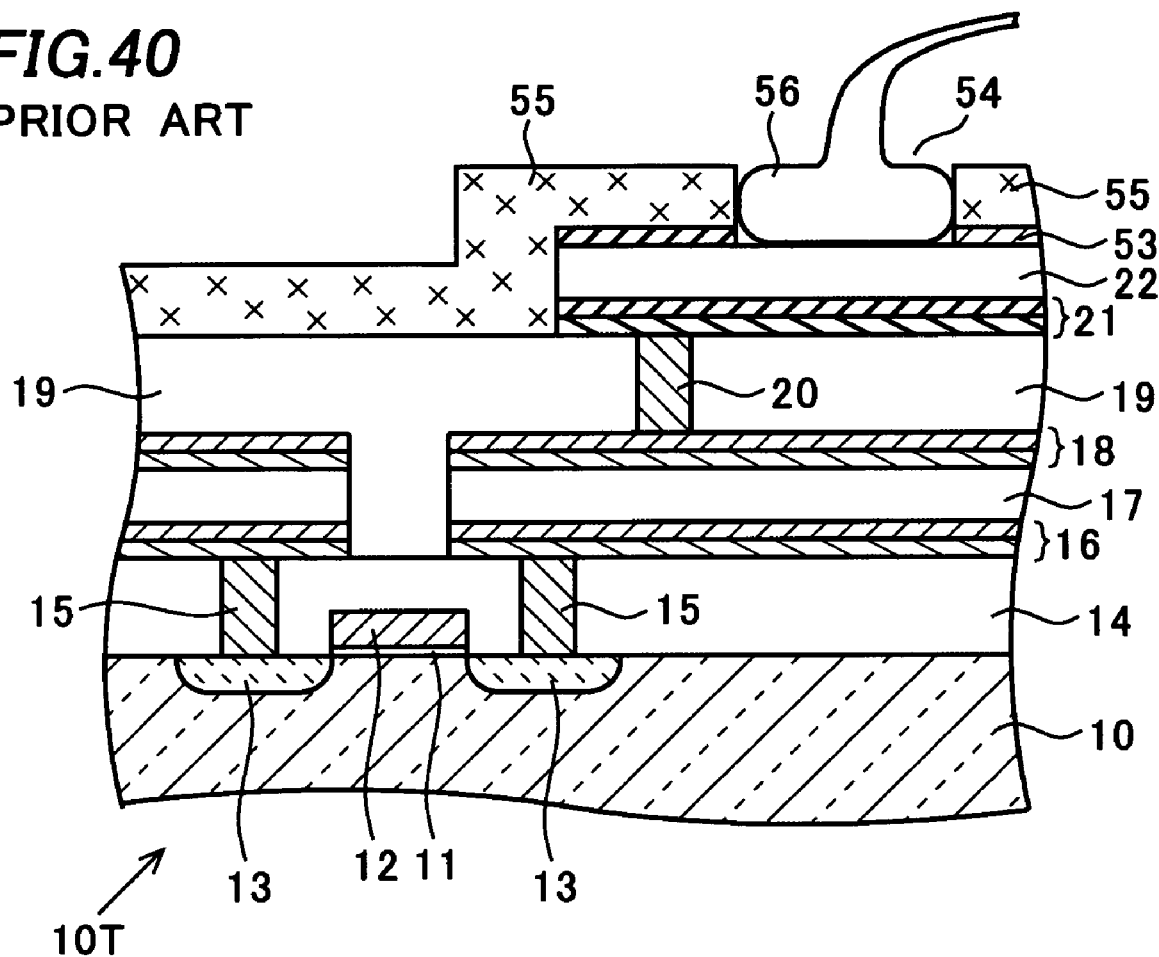
FIG. 40 is a cross-sectional view showing a semiconductor device and its manufacturing method of a conventional art.
Figure 41A:
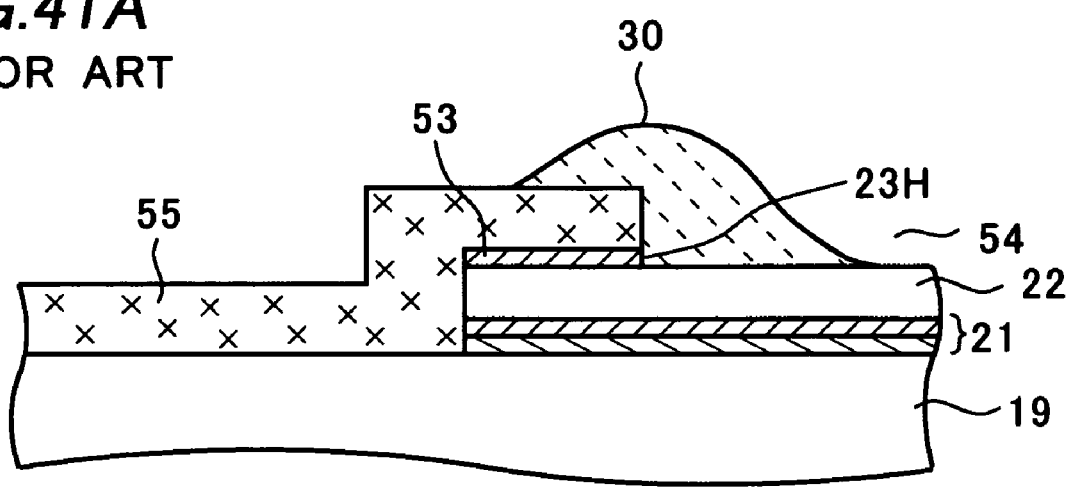
FIGS. 41A and 41B are cross-sectional views showing the semiconductor device of the conventional art.
Figure 41B:
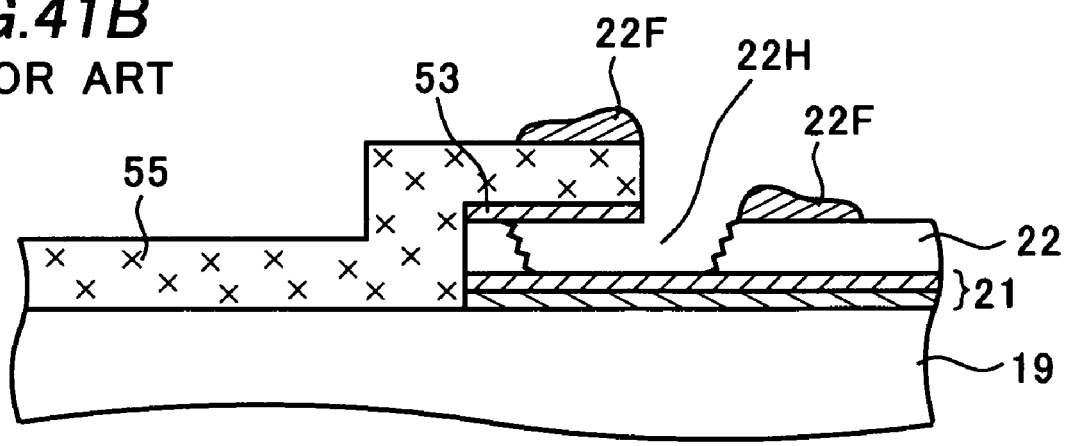

The semiconductor device of this embodiment has the same components as the conventional semiconductor device shown in FIG. 40 from the semiconductor substrate 10 to the second wiring layer 22. Therefore, the description of the semiconductor device of this embodiment will be made on the components formed above the second wiring layer 22 only in FIGS. 1 to 5. The components formed below the second interlayer insulation film 19 are omitted in the figures.

Figure 1:
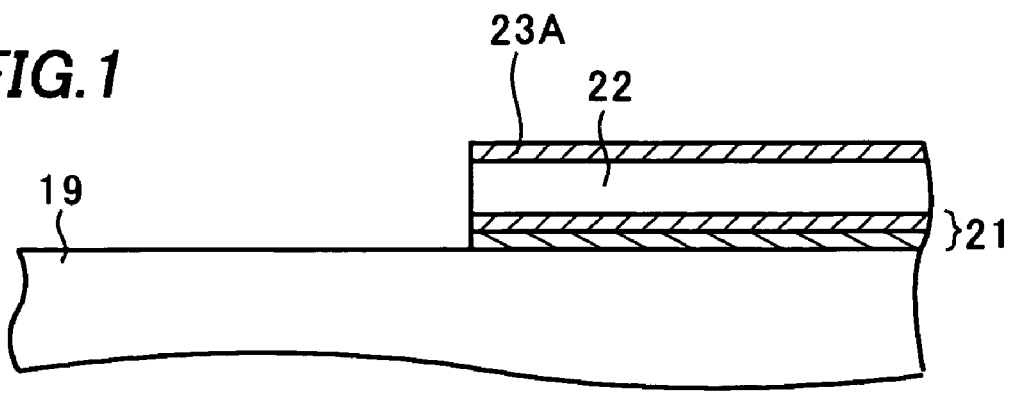
FIGS. 1 to 4 are cross-sectional views showing a method of manufacturing a semiconductor device of the first embodiment of the invention.

A second wiring layer 22 and an antireflection layer 23A are formed into a predetermined pattern through patterning processes including a photolithography (exposure and development of a resist layer (not shown)), as shown in FIG. 1. The second wiring layer 22 is not necessarily made of aluminum (Al), and can be made of an aluminum alloy, for example, an aluminum alloy of aluminum (Al) and copper (Cu). Alternatively, the second wiring layer 22 can be made of an aluminum alloy of aluminum (Al), silicon (Si), and copper (Cu). The second wiring layer 22 has a thickness of, for example, about 950 nm.

The antireflection layer 23A has the same function as the antireflection layer 53 of FIG. 40, and made of, for example, titanium nitride (TiN) but can be made of the other titanium alloy or titanium (Ti). The antireflection layer 23A has a thickness of, for example, about 20 to 80 nm.

Figure 2:
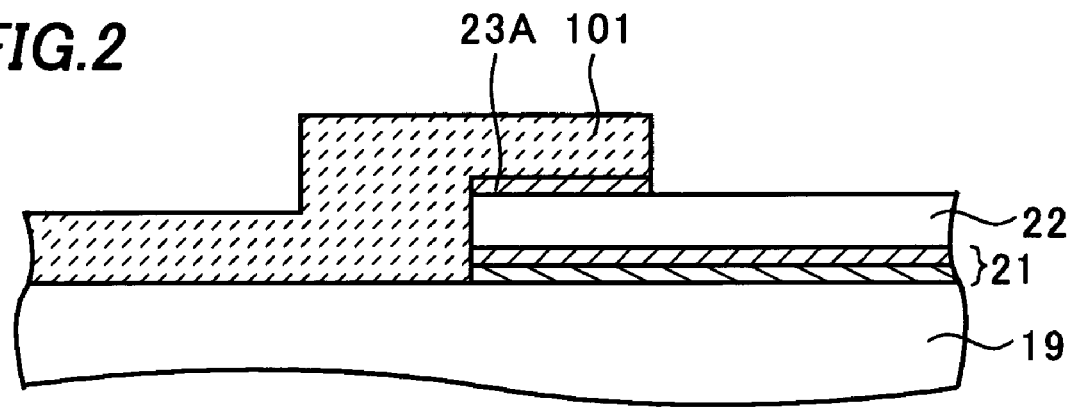

Next, a first resist layer 101 is formed so as to cover a portion of the third barrier layer 21 and a portion of the antireflection layer 23A, as shown in FIG. 2. Then, the antireflection layer 23A is dry-etched with a gas made of, for example, $CHF_3$ and $O_2$ using the first resist layer 101 as a mask, to expose a portion of the second wiring layer 22. After this etching, the first resist layer 101 is removed.

Figure 3:
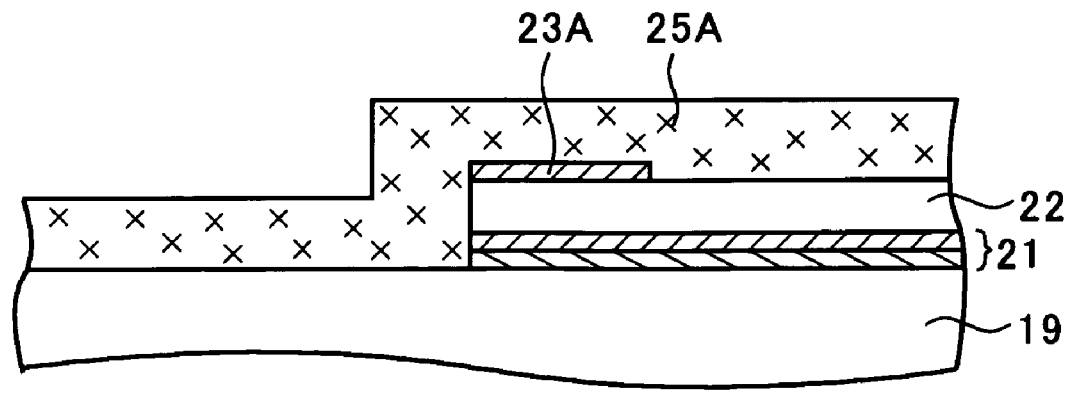

Next, a passivation layer 25A is formed so as to cover the third barrier layer 21, the second wiring layer 22, and the antireflection layer 23A, as shown in FIG. 3. This passivation layer 25A is preferably made of two layers of a silicon oxide film ($SiO_2$) and a silicon nitride film (SiN) which are layered in this order by a plasma CVD method, although not limited particularly as long as it is made of an inorganic film. Alternatively, the passivation layer 25A can be made of either one of the silicon oxide film ($SiO_2$) or the silicon nitride film (SiN). The passivation layer 25A has a thickness of, for example, about 900 nm.

Figure 4:
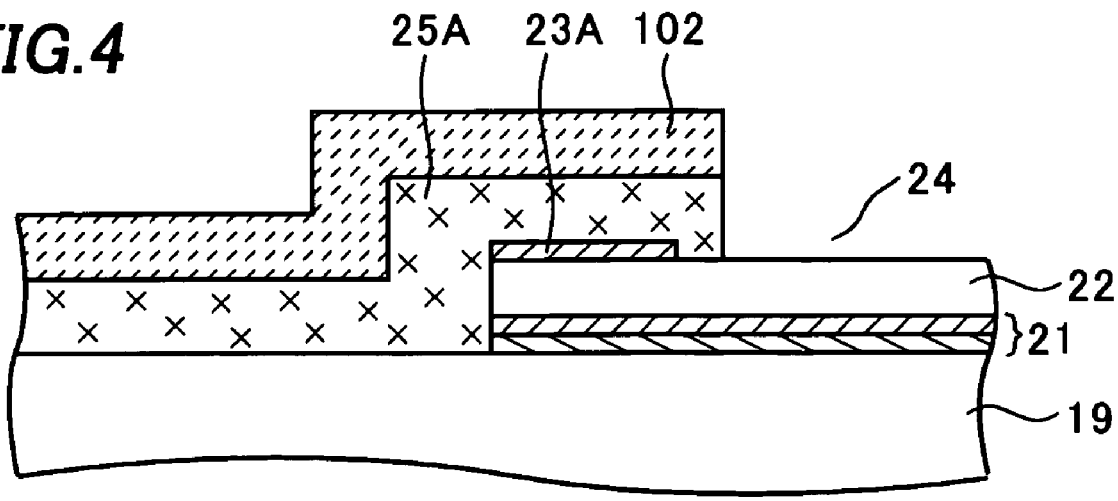
Figure 5:
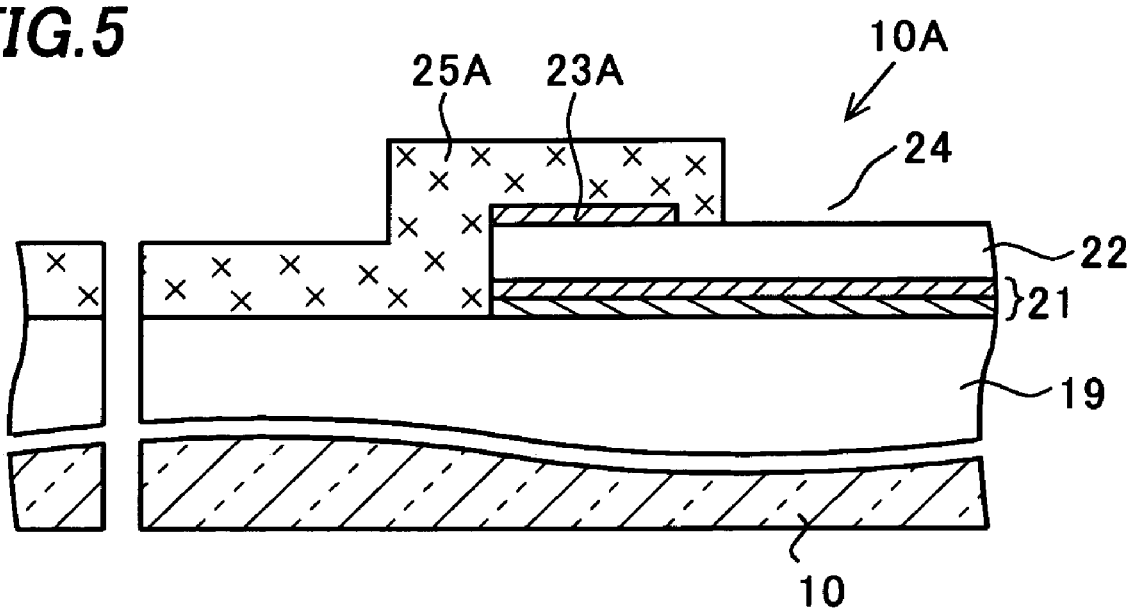
FIG. 5 is a cross-sectional view showing the semiconductor device and its manufacturing method of the first embodiment of the invention.

Next, a second resist layer 102 is formed on the passivation layer 25A in a region corresponding to a portion of the third barrier layer 21, the remaining antireflection layer 23A, and a portion of the second wiring layer 22 where the antireflection layer 23A does not remain, as shown in FIG. 4. Then, a portion of the passivation layer 25A is removed by dry-etching with a gas containing fluorine (F), for example, a gas made of $CHF_3$ and $O_2$, a gas made of $CF_4$ and $O_2$, a gas made of $SF_6$, or the like using the second resist layer 102 as a mask.

Thus, an opening 24 exposing a portion of the second wiring layer 22 and not exposing an end portion of the antireflection layer 23A is formed in the passivation layer 25A. That is, the end portion of the antireflection layer 23A is covered with the passivation layer 25A. Although the cross-sectional view of FIG. 4 only shows a portion of the sidewall of the opening 24, the antireflection layer 23A is covered with the passivation layer 25A in the other portion of the sidewall of the opening 24. After the etching, the second resist layer 102 is removed.

Next, the semiconductor substrate 10 and the layers layered thereon are divided into a plurality of semiconductor dice 10A by dicing along a dicing line (not shown), as shown in FIG. 5.

As described above, the antireflection layer 23A is covered with the passivation layer 25A and not exposed in the opening 24 in this embodiment. Furthermore, since the passivation layer 25A is formed by a plasma CVD method, the layer 25A is firmly bonded to the second wiring layer 22.

Thus, moisture containing impurities, that is, moisture used in the manufacturing process (e.g. water for dicing containing $CO_2$ for preventing static electricity), moisture in the air, or the like does not reach the antireflection layer 23A, and this prevents cell reaction occurring between a titanium (Ti) component of the antireflection layer and an aluminum (Al) component of the second wiring layer 22 as has been seen in the conventional art. That is, aluminum that forms the second wiring layer 22 is prevented from being eluted. As a result, a connection failure when a wire is bonded to the second wiring layer 22 exposed in the opening 24 can be minimized, and the yield of the semiconductor device can be enhanced.

Next, a semiconductor device of the second embodiment of the invention will be described referring to figures. FIGS. 6 to 9 are cross-sectional views showing a method of manufacturing the semiconductor device of this embodiment. FIG. 10 is a cross-sectional view showing the semiconductor device and its manufacturing method of this embodiment.

The description of the semiconductor device of this embodiment will be made on the components formed above the second wiring layer 22 only in FIGS. 6 to 10, as in the first embodiment. The other components and the manufacturing method thereof are the same as those of the conventional art shown in FIG. 40. The components formed below the second interlayer insulation film 19 are omitted in the figures.

Figure 6:
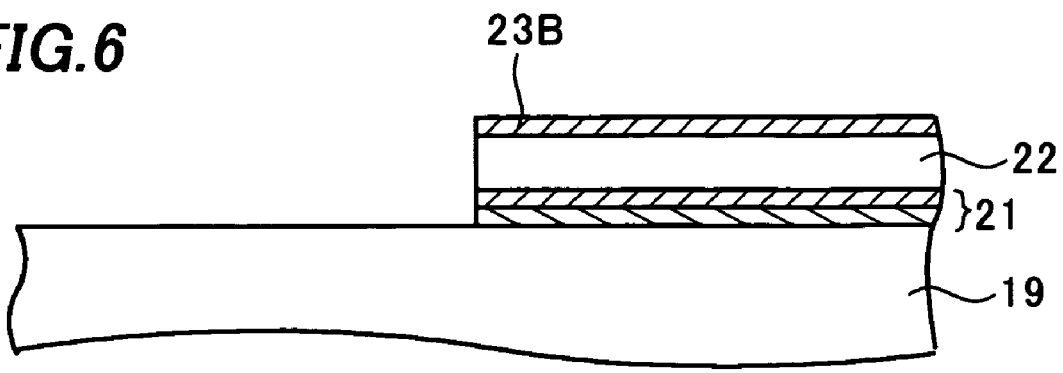
FIGS. 6 to 9 are cross-sectional views showing a method of manufacturing a semiconductor device of the second embodiment of the invention.

The second wiring layer 22 and an antireflection layer 23B are formed into a predetermined pattern through patterning processes including a photolithography, as shown in FIG. 6. The antireflection layer 23B is made of the same metal as the antireflection layer 23A of the first embodiment.

Figure 7:
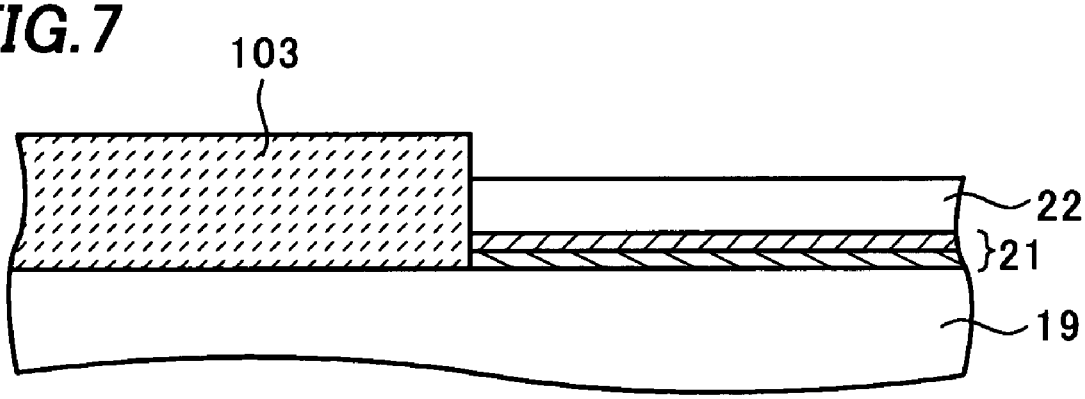

Next, as shown in FIG. 7, a third resist layer 103 is formed on the second interlayer insulation film 19 where the second wiring layer 22 is not formed. Then, the antireflection layer 23B is removed by dry-etching with a gas made of, for example, $CHF_3$ and $O_2$ using the third resist layer 103 as a mask. After this etching, the third resist layer 103 is removed.

Figure 8:
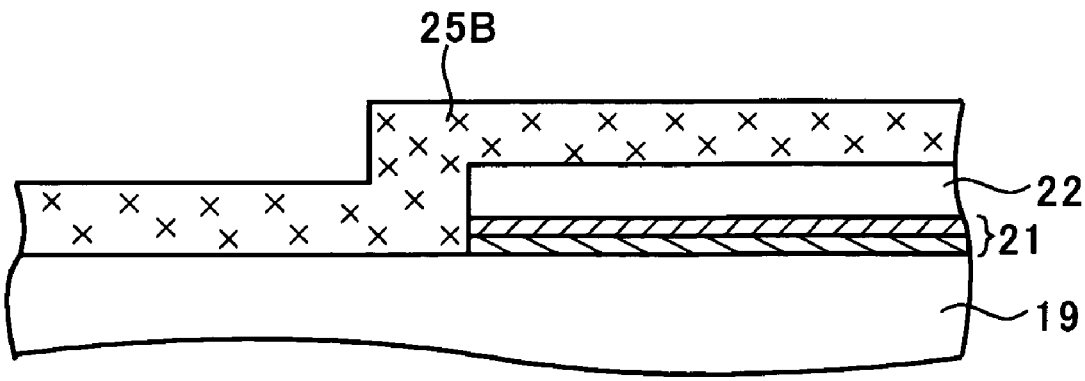

Next, a passivation layer 25B is formed so as to cover the third barrier layer 21 and the second wiring layer 22, as shown in FIG. 8. This passivation layer 25B is made of a layer or a plurality of layers of the same material with the same thickness by the same deposition method as the passivation layer 25A of the first embodiment.

Figure 9:
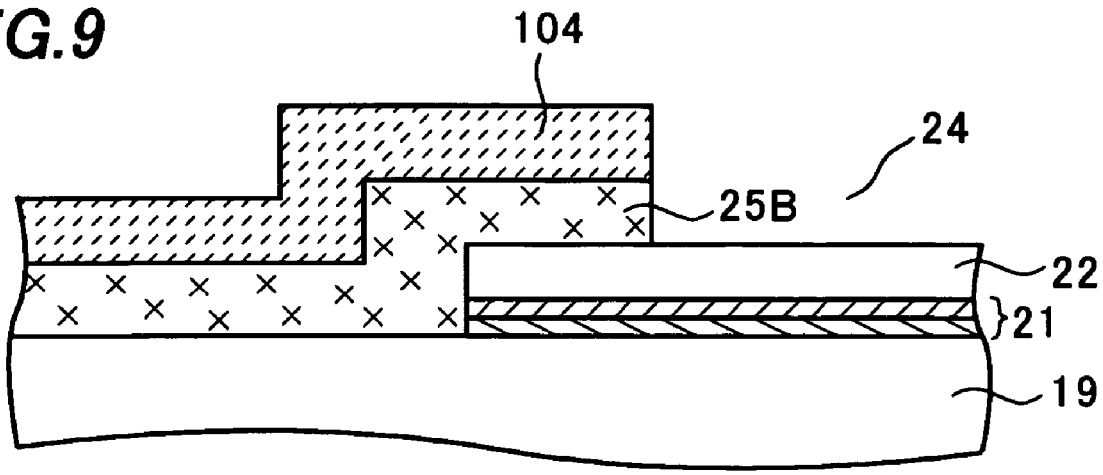
Figure 10:
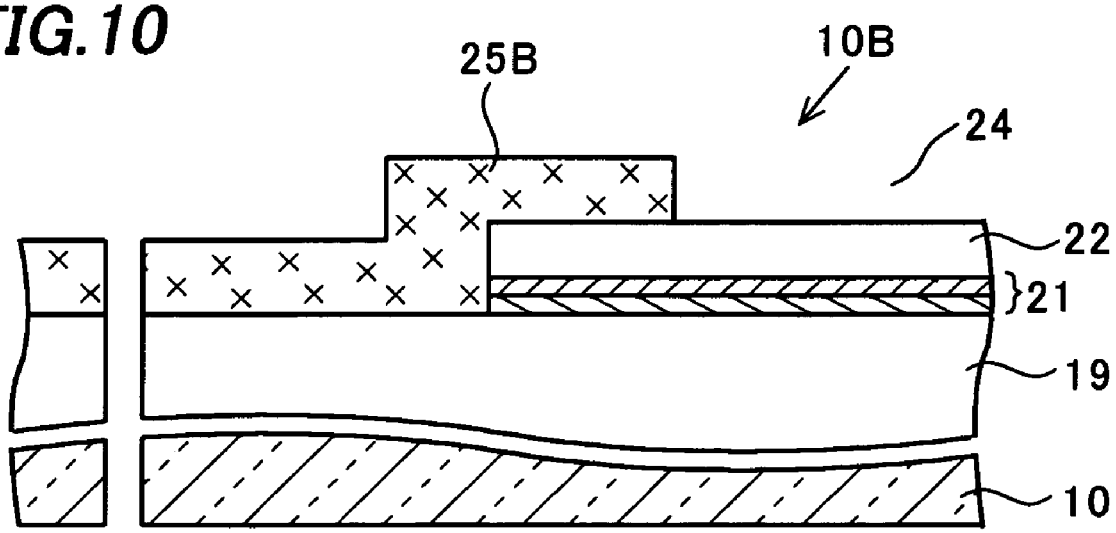
FIG. 10 is a cross-sectional view showing the semiconductor device and its manufacturing method of the second embodiment of the invention.

Next, as shown in FIG. 9, a fourth resist layer 104 is formed on the passivation layer 25B in a region corresponding to a portion of the third barrier layer 21 and a portion of the second wiring layer 22. Then, a portion of the passivation layer 25B is removed by dry-etching with a gas including fluorine (F), for example, a gas made of $CHF_3$ and $O_2$, a gas made of $CF_4$ and $O_2$, a gas made of $SF_6$, or the like using the fourth resist layer 104 as a mask. After this etching, the fourth resist layer 104 is removed. Thus, an opening 24 exposing a portion of the second wiring layer 22 is formed in the passivation layer 25B.

Next, the semiconductor substrate 10 and the layers layered thereon are divided into a plurality of semiconductor dice 10B by dicing along a dicing line (not shown), as shown in FIG. 10.

As described above, the antireflection layer 23B does not exist on the second wiring layer 22 in this embodiment. This prevents cell reaction from occurring between a titanium (Ti) component of the antireflection layer and an aluminum (Al) component of the second wiring layer 22 as has been seen in the conventional art, and aluminum that forms the second wiring layer 22 from being eluted. As a result, a connection failure when a wire is bonded to the second wiring layer 22 exposed in the opening 24 can be minimized, and the yield of the semiconductor device can be enhanced.

Next, a semiconductor device of the third embodiment of the invention will be described referring to figures. FIGS. 11 to 15 are cross-sectional views showing a method of manufacturing the semiconductor device of this embodiment. FIG. 16 is a cross-sectional view showing the semiconductor device and its manufacturing method of this embodiment.

The description of the semiconductor device of this embodiment will be made on the components formed above the second wiring layer 22 only in FIGS. 11 to 16, as in the first embodiment. The other components and the manufacturing method thereof are the same as those of the conventional art shown in FIG. 40. The components formed below the second interlayer insulation film 19 are omitted in the figures.

Figure 11:
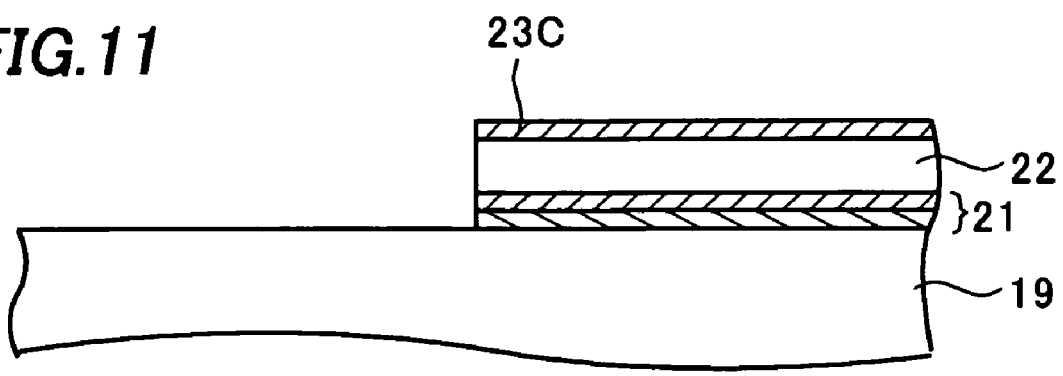
FIGS. 11 to 15 are cross-sectional views showing a method of manufacturing a semiconductor device of the third embodiment of the invention.

The second wiring layer 22 and an antireflection layer 23C are formed into a predetermined pattern through patterning processes including a photolithography, as shown in FIG. 11. The antireflection layer 23C is made of the same metal as the antireflection layer 23A of the first embodiment.

Figure 12:
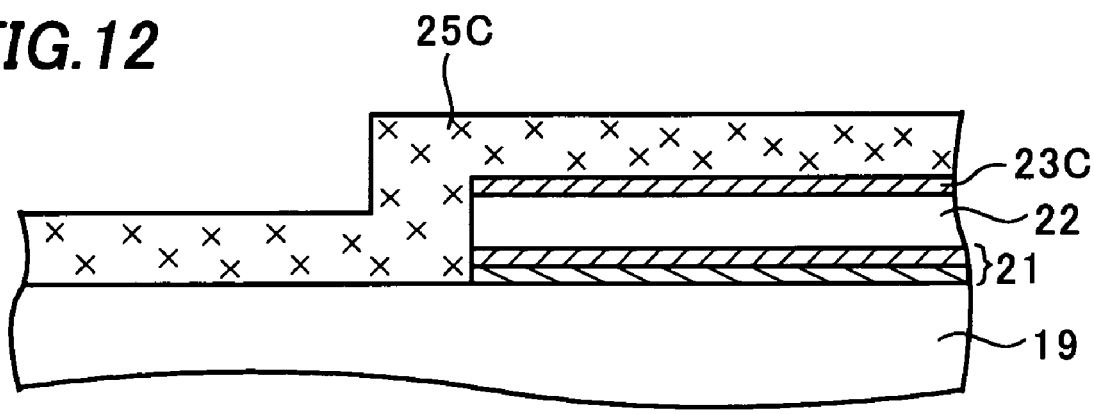

Next, a first passivation layer 25C is formed so as to cover the third barrier layer 21, the second wiring layer 22, and the antireflection layer 23C as shown in FIG. 12. This first passivation layer 25C is made of a layer or a plurality of layers of the same material with the same thickness by the same deposition method as the passivation layer 25A of the first embodiment.

Figure 13:
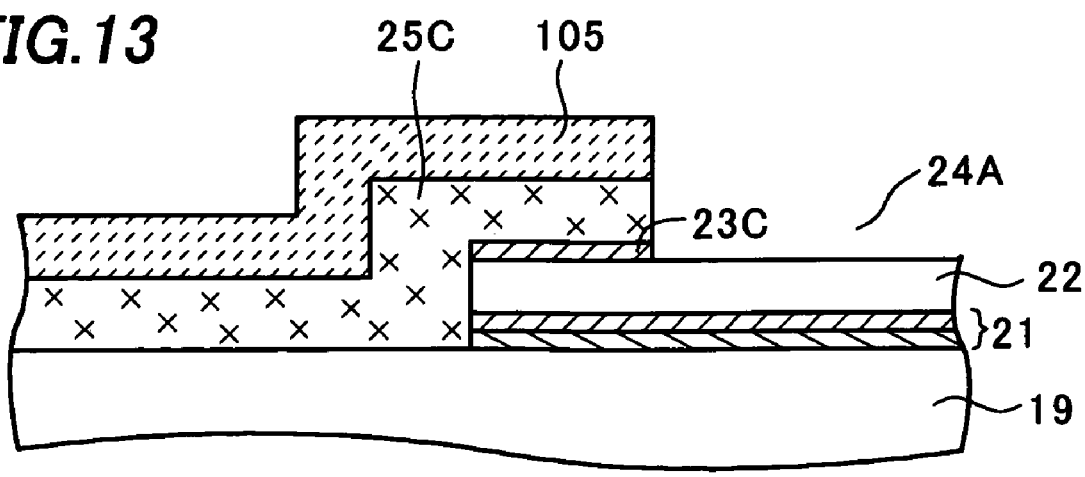

Next, as shown in FIG. 13, a fifth resist layer 105 is formed on the first passivation layer 25C in a region corresponding to a portion of the third barrier layer 21 and a portion of the second wiring layer 22. Then, a portion of the first passivation layer 25C and antireflection layer 23C is removed by dry-etching with a gas containing fluorine (F), for example, a gas made of $CHF_3$ and $O_2$, a gas made of $CF_4$ and $O_2$, a gas made of $SF_6$, or the like using the fifth resist layer 105 as a mask. Thus, an opening 24A exposing a portion of the second wiring layer 22 is formed in the first passivation layer 25C.

Figure 14:
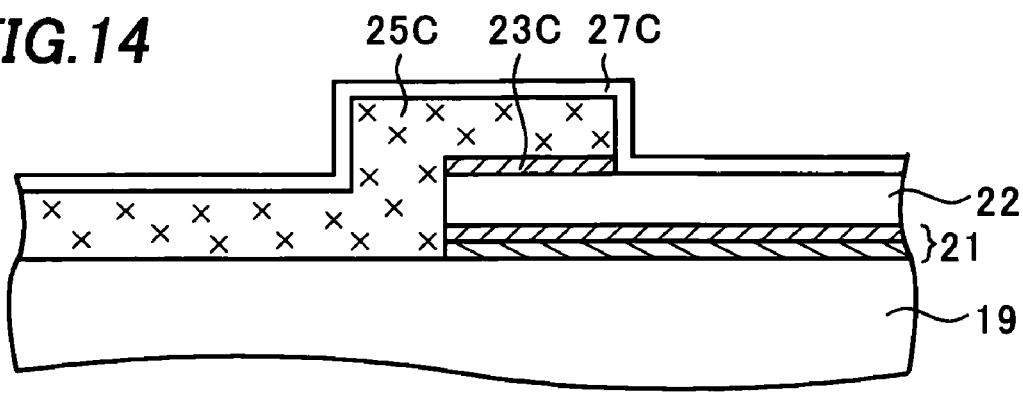

Furthermore, as shown in FIG. 14, a second passivation layer 27C is formed so as to cover the first passivation layer 25C and the inner surface of the opening 24A. This second passivation layer 27C is made of the same material by the same deposition method as the first passivation layer 25C. The second passivation layer 27C has a thickness of, for example, about 30 to 100 nm.

Figure 15:
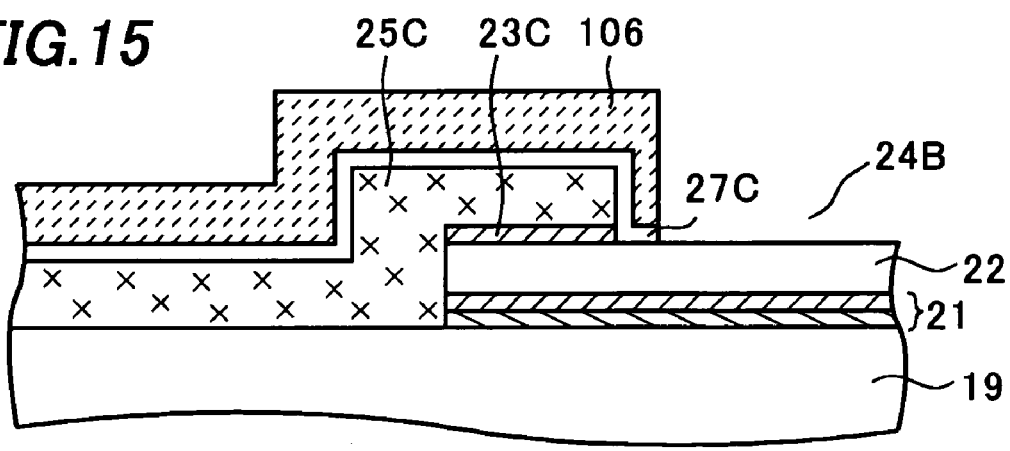
Figure 16:
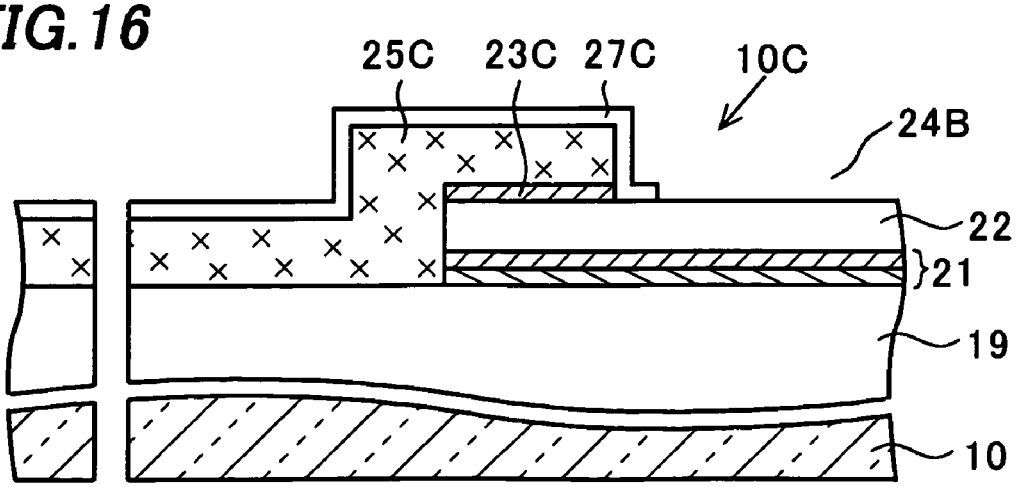
FIG. 16 is a cross-sectional view showing the semiconductor device and its manufacturing method of the third embodiment of the invention.

Next, as shown in FIG. 15, a sixth resist layer 106 is formed on the second passivation layer 27C in a region corresponding to a portion of the third barrier layer 21, the remaining antireflection layer 23C, and a portion of the second wiring layer 22 where the antireflection layer 23C does not remain. Then, a portion of the second passivation layer 27C is removed by dry-etching with a gas containing fluorine (F), for example, a gas made of $CHF_3$ and $O_2$, a gas made of $CF_4$ and $O_2$, a gas made of $SF_6$, or the like using the sixth resist layer 106 as a mask. After this etching, the sixth resist layer 106 is removed.

Thus, an opening 24B exposing a portion of the second wiring layer 22 and not exposing an end portion of the antireflection layer 23C is formed in the first passivation layer 25C and the second passivation layer 27C.

Generally, a resist layer on the bottom portion of the sidewall of an opening is not always patterned precisely due to reflection of exposure. Therefore, the bottom portion of the sidewall of the opening 24B can be removed more than need be when the second passivation layer 27C is etched, thereby exposing the antireflection layer 23C. By forming the sixth resist layer 106 onto the second wiring layer 22 where the antireflection layer 23C does not remain, as in this embodiment, the second passivation layer 27C can completely cover the end portion of the antireflection layer 23C in the opening 24B even after the etching.

Next, the semiconductor substrate 10 and the layers layered thereon are divided into a plurality of semiconductor dice 10C by dicing along a dicing line (not shown), as shown in FIG. 16.

As described above, the antireflection layer 23C is covered with the second passivation layer 27C and is not exposed in the opening 24B, in this embodiment. Thus, moisture containing impurities, that is, moisture used in the manufacturing process (e.g. water for dicing containing $CO_2$ for preventing static electricity), moisture in the air, or the like does not reach the antireflection layer 23C, and this prevents cell reaction occurring between a titanium (Ti) component of the antireflection layer and an aluminum (Al) component of the second wiring layer 22 as has been seen in the conventional art. That is, aluminum that forms the second wiring layer 22 is prevented from being eluted. As a result, a connection failure when a wire is bonded to the second wiring layer 22 exposed in the opening 24B can be minimized, and the yield of the semiconductor device can be enhanced.

Next, a semiconductor device of the fourth embodiment of the invention will be described referring to figures. FIGS. 17 to 21 are cross-sectional views showing a method of manufacturing the semiconductor device of this embodiment. FIG. 22 is a cross-sectional view showing the semiconductor device and its manufacturing method of this embodiment.

The description of the semiconductor device of this embodiment will be made on the components formed above the second wiring layer 22 only in FIGS. 17 to 22, as in the first embodiment. The other components and the manufacturing method thereof are the same as those of the conventional art shown in FIG. 40. The components formed below the second interlayer insulation film 19 are omitted in the figures.

Figure 17:
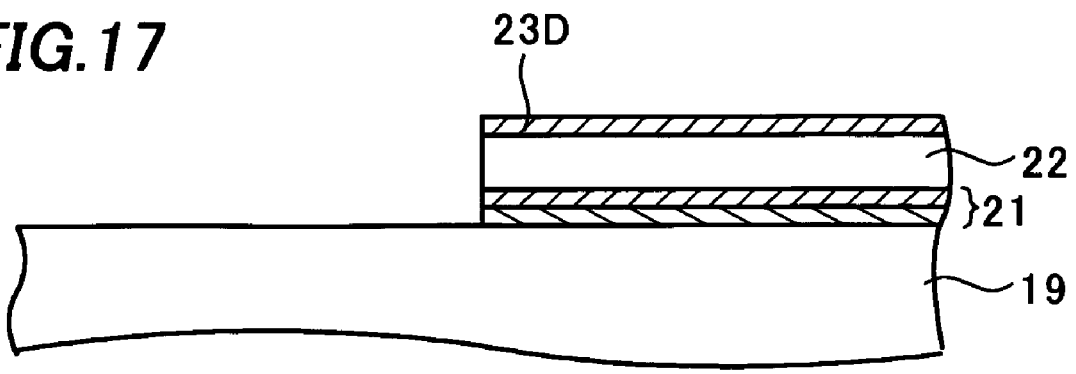
FIGS. 17 to 21 are cross-sectional views showing a method of manufacturing a semiconductor device of the fourth embodiment of the invention.

The second wiring layer 22 and an antireflection layer 23D are formed into a predetermined pattern through patterning processes including a photolithography, as shown in FIG. 17. The antireflection layer 23D is made of the same metal as the antireflection layer 23A of the first embodiment.

Figure 18:
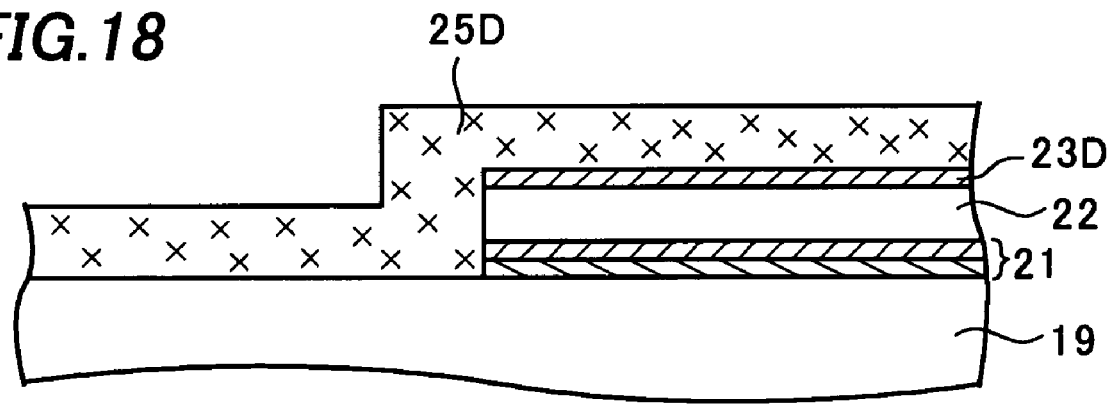

Next, a first passivation layer 25D is formed so as to cover the third barrier layer 21, the second wiring layer 22, and the antireflection layer 23D as shown in FIG. 18. This first passivation layer 25D is made of a layer or a plurality of layers of the same material with the same thickness by the same deposition method as the passivation layer 25A of the first embodiment.

Figure 19:
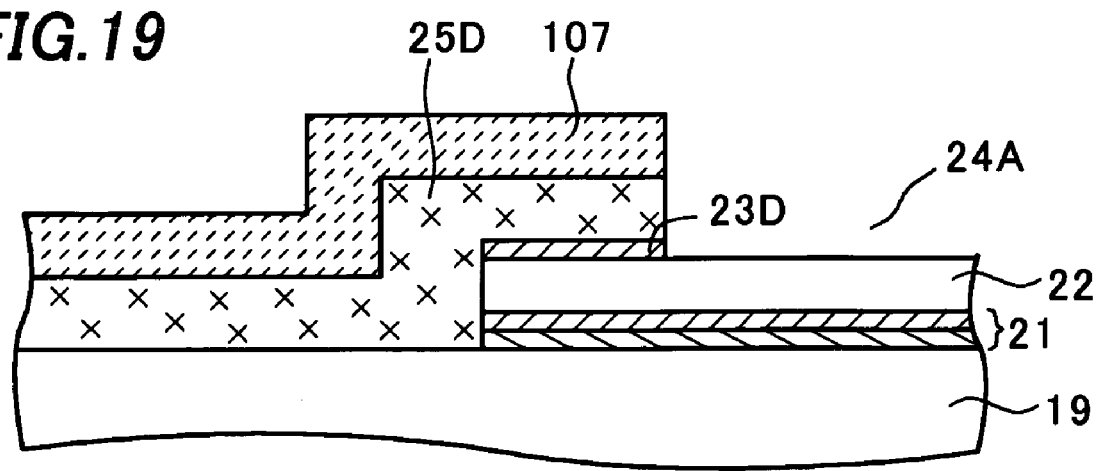

Next, as shown in FIG. 19, a seventh resist layer 107 is formed on the first passivation layer 25D in a region corresponding to a portion of the third barrier layer 21 and a portion of the second wiring layer 22. Then, a portion of the passivation layer 25D and a portion of the antireflection layer 23D are removed by dry-etching with a gas containing fluorine (F), for example, a gas made of $CHF_3$ and $O_2$, a gas made of $CF_4$ and $O_2$, a gas made of $SF_6$, or the like using the seventh resist layer 107 as a mask. Thus, an opening 24A exposing a portion of the second wiring layer 22 is formed in the passivation layer 25D.

Figure 20:
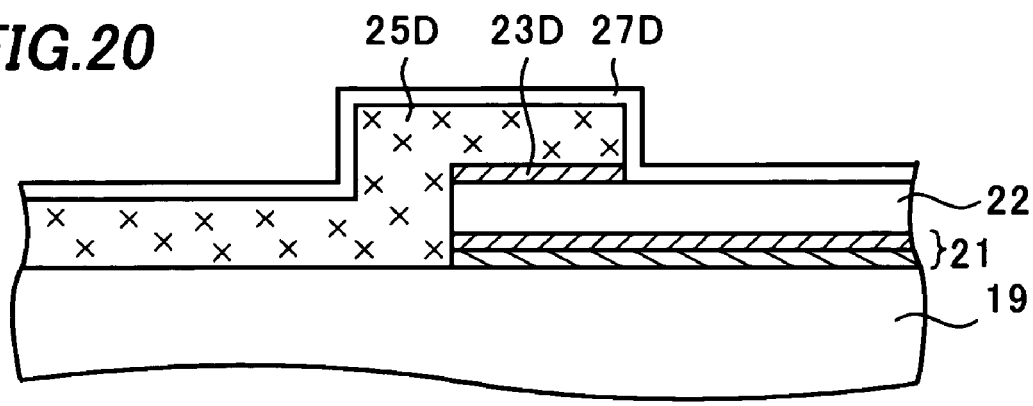

Next, a second passivation layer 27D is formed so as to cover the first passivation layer 25D and the inner surface of the opening 24A, as shown in FIG. 20. This second passivation layer 27D is made of the same material by the same deposition method as the first passivation layer 25D. The second passivation layer 27D has a thickness of, for example, about 30 to 200 nm.

Figure 21:
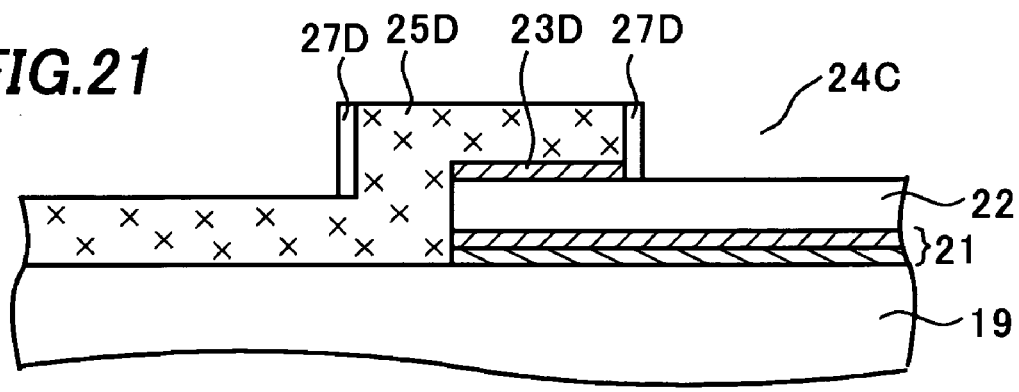
Figure 22:
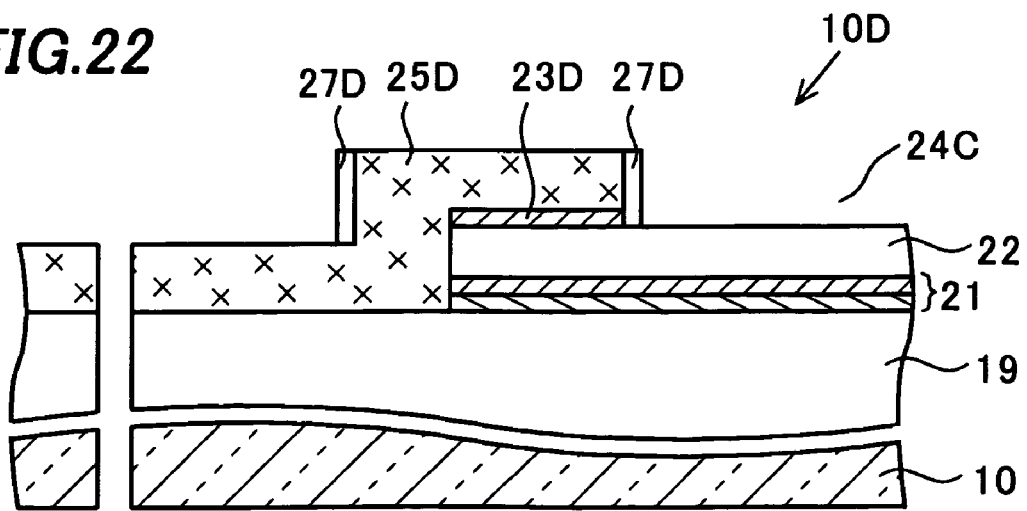
FIG. 22 is a cross-sectional view showing the semiconductor device and its manufacturing method of the fourth embodiment of the invention.

Next, the surface of the second passivation layer 27D is sputter-etched with an argon gas until the surface of the second wiring layer 22 is exposed, as shown in FIG. 21.

Thus, an opening 24C exposing a portion of the second wiring layer 22 and not exposing an end portion of the antireflection layer 23D is formed in the first passivation layer 25D and the second passivation layer 27D.

Next, the semiconductor substrate 10 and the layers layered thereon are divided into a plurality of semiconductor dice 10D by dicing along a dicing line (not shown), as shown in FIG. 22.

As described above, the antireflection layer 23D is covered with the second passivation layer 27D and not exposed in the opening 24C in this embodiment. Thus, moisture containing impurities, that is, moisture used in the manufacturing process (e.g. water for dicing containing $CO_2$ for preventing static electricity), moisture in the air, or the like does not reach the antireflection layer 23D, and this prevents cell reaction occurring between a titanium (Ti) component of the antireflection layer and an aluminum (Al) component of the second wiring layer 22 as has been seen in the conventional art. That is, aluminum that forms the second wiring layer 22 is prevented from being eluted. As a result, a connection failure when a wire is bonded to the second wiring layer 22 exposed in the opening 24C can be minimized, and the yield of the semiconductor device can be enhanced.

Next, a semiconductor device of the fifth embodiment of the invention will be described referring to figures. FIGS. 23 to 27 are cross-sectional views showing a method of manufacturing the semiconductor device of this embodiment. FIG. 28 is a cross-sectional view showing the semiconductor device and its manufacturing method of this embodiment.

The description of the semiconductor device of this embodiment will be made on the components formed above the second wiring layer 22 only in FIGS. 23 to 28, as in the first embodiment. The other components and the manufacturing method thereof are the same as those of the conventional art shown in FIG. 40. The components formed below the second interlayer insulation film 19 are omitted in the figures.

Figure 23:
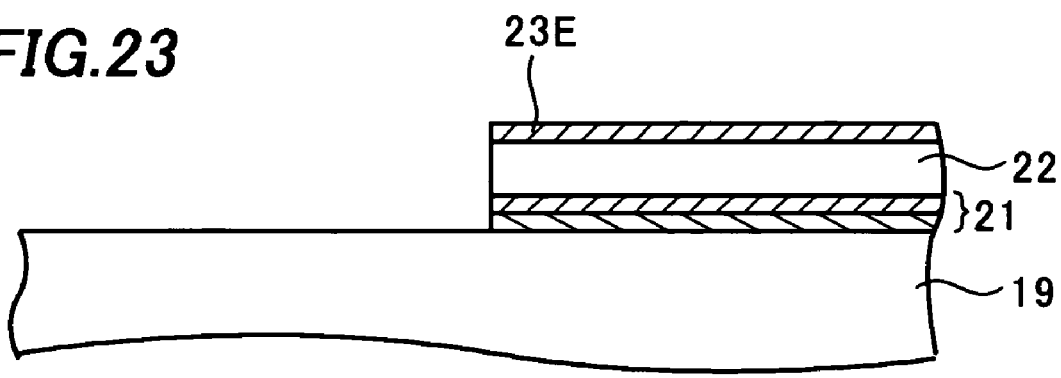
FIGS. 23 to 27 are cross-sectional views showing a method of manufacturing a semiconductor device of the fifth embodiment of the invention.

The second wiring layer 22 and an antireflection layer 23E are formed into a predetermined pattern through patterning processes including a photolithography, as shown in FIG. 23. The antireflection layer 23E is made of the same metal as the antireflection layer 23A of the first embodiment.

Figure 24:
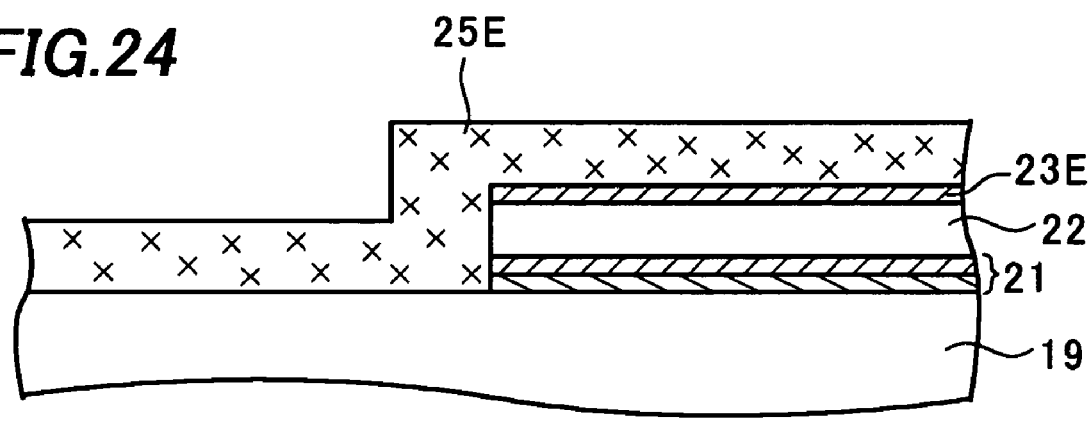

Next, a first passivation layer 25E is formed so as to cover the third barrier layer 21, the second wiring layer 22, and the antireflection layer 23E as shown in FIG. 24. This first passivation layer 25E is made of a layer or a plurality of layers of the same material with the same thickness by the same deposition method as the passivation layer 25E of the first embodiment.

Figure 25:
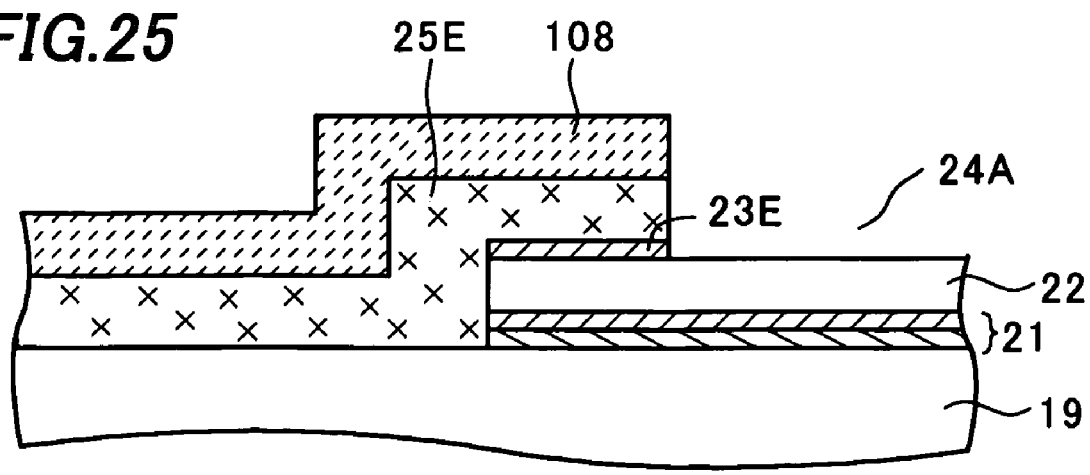

Next, as shown in FIG. 25, an eighth resist layer 108 is formed on the passivation layer 25E in a region corresponding to a portion of the third barrier layer 21 and a portion of the second wiring layer 22. Then, a portion of the passivation layer 25E and a portion of the antireflection layer 23E are removed by dry-etching with a gas containing fluorine (F), for example, a gas made of $CHF_3$ and $O_2$, a gas made of $CF_4$ and $O_2$, a gas made of $SF_6$, or the like using the eighth resist layer 108 as a mask. Thus, an opening 24A exposing a portion of the second wiring layer 22 is formed in the passivation layer 25E.

Figure 26:
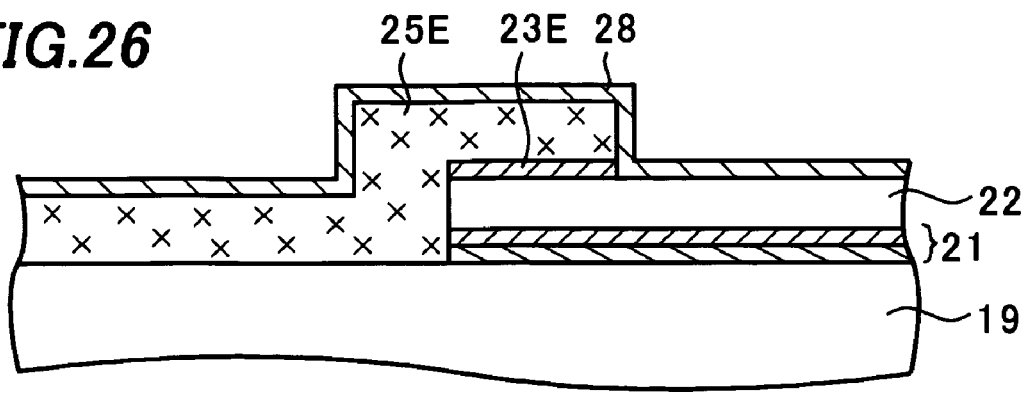

Furthermore, as shown in FIG. 26, a metal layer 28 is formed so as to cover the first passivation layer 25E and the inner surface of the opening 24A. This metal layer 28 is preferably made of aluminum (Al) by a sputtering method. The metal layer 28 has a thickness of, for example, about 10 to 1000 nm.

Figure 27:
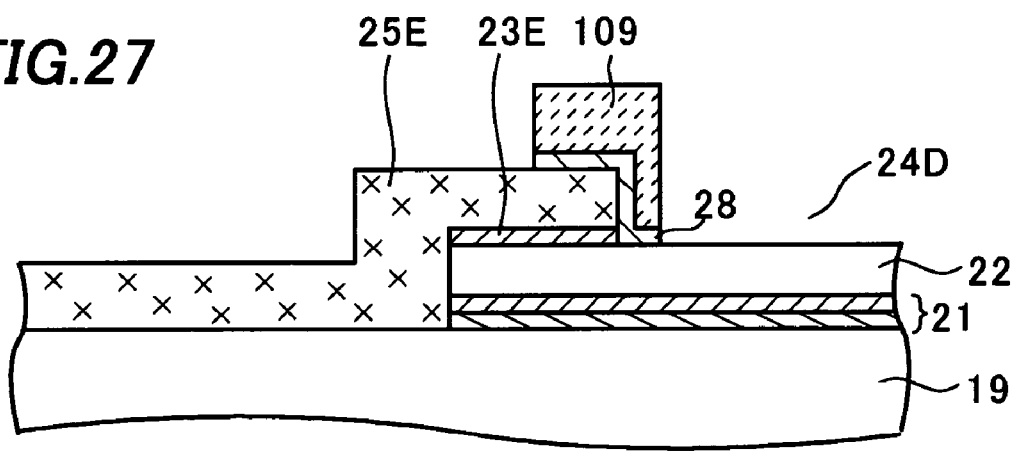
Figure 28:
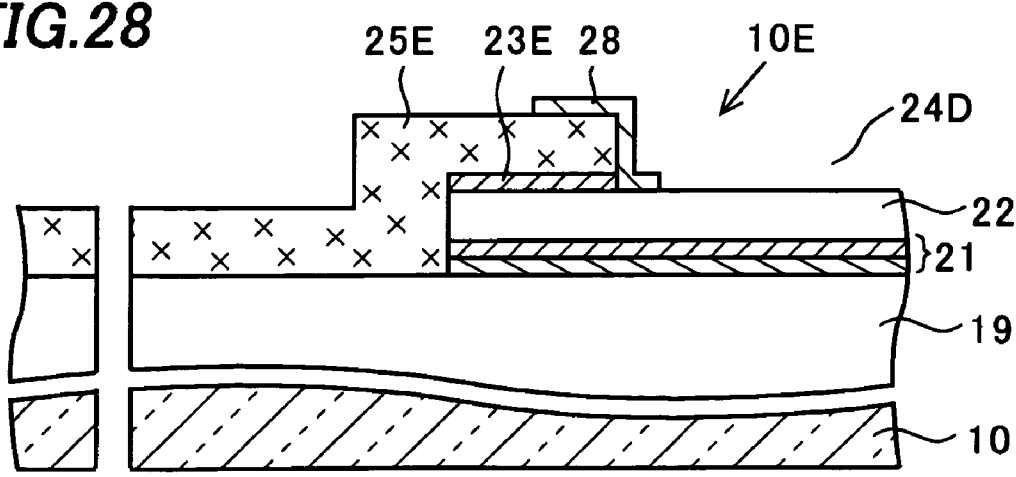
FIG. 28 is a cross-sectional view showing the semiconductor device and its manufacturing method of the fifth embodiment of the invention.

Next, as shown in FIG. 27, a ninth resist layer 109 is formed on the metal layer 28 in a region corresponding to a portion of the third barrier layer 21, the remaining antireflection layer 23E, and a portion of the second wiring layer 22 where the antireflection layer 23E does not remain. Then, a portion of the metal layer 28 is removed by dry-etching with a gas containing fluorine (F), for example, a gas made of $CHF_3$ and $O_2$, a gas made of $CF_4$ and $O_2$, a gas made of $SF_6$, or the like using the ninth resist layer 109 as a mask. After this etching, the ninth resist layer 109 is removed.

Thus, an opening 24D exposing a portion of the second wiring layer 22 and not exposing an end portion of the antireflection layer 23E is formed in the passivation layer 25E and the metal layer 28.

Generally, a resist layer on the bottom portion of the sidewall of an opening is not always patterned precisely due to reflection of exposure. Therefore, the bottom portion of the sidewall of the opening 24D can be removed more than need be when the metal layer 28 is etched, thereby exposing the antireflection layer 23E. By forming the ninth resist layer 109 onto the second wiring layer 22 where the antireflection layer 23E does not remain, as in this embodiment, the metal layer 28 can completely cover the end portion of the antireflection layer 23E in the opening 24D even after the etching.

Next, the semiconductor substrate 10 and the layers layered thereon are divided into a plurality of semiconductor dice 10E by dicing along a dicing line (not shown), as shown in FIG. 28.

As described above, the antireflection layer 23E is covered with the metal layer 28 and not exposed in the opening 24D in this embodiment. Thus, moisture containing impurities, that is, moisture used in the manufacturing process (e.g. water for dicing containing $CO_2$ for preventing static electricity), moisture in the air, or the like does not reach the antireflection layer 23E, and this prevents cell reaction occurring between a titanium (Ti) component of the antireflection layer and an aluminum (Al) component of the second wiring layer 22 as has been seen in the conventional art. That is, aluminum that forms the second wiring layer 22 is prevented from being eluted. As a result, a connection failure when a wire is bonded to the second wiring layer 22 exposed in the opening 24D can be minimized, and the yield of the semiconductor device can be enhanced.

Next, a semiconductor device of the sixth embodiment of the invention will be described referring to figures. FIGS. 29 to 33 are cross-sectional views showing a method of manufacturing the semiconductor device of this embodiment. FIG. 34 is a cross-sectional view showing the semiconductor device and its manufacturing method of this embodiment.

The description of the semiconductor device of this embodiment will be made on the components formed above the second wiring layer 22 only in FIGS. 29 to 34, as in the first embodiment. The other components and the manufacturing method thereof are the same as those of the conventional art shown in FIG. 40. The components formed below the second interlayer insulation film 19 are omitted in the figures.

Figure 29:
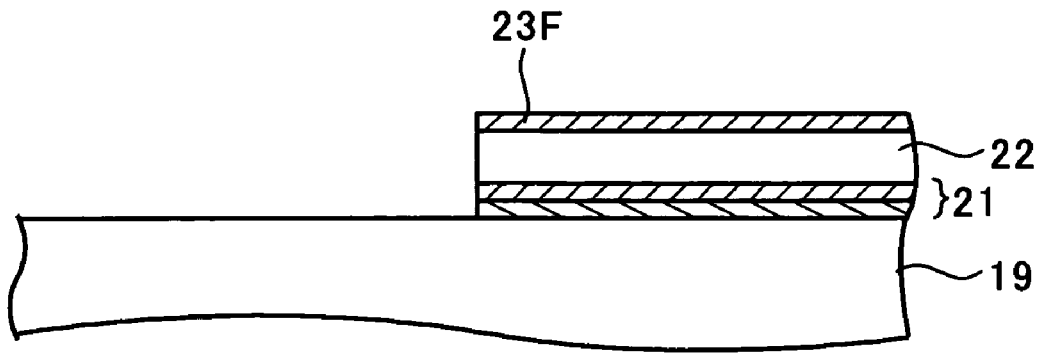
FIGS. 29 to 33 are cross-sectional views showing a method of manufacturing a semiconductor device of the sixth embodiment of the invention.

The second wiring layer 22 and an antireflection layer 23F are formed into a predetermined pattern through patterning processes including a photolithography, as shown in FIG. 29. The antireflection layer 23F is made of the same metal as the antireflection layer 23A of the first embodiment.

Figure 30:
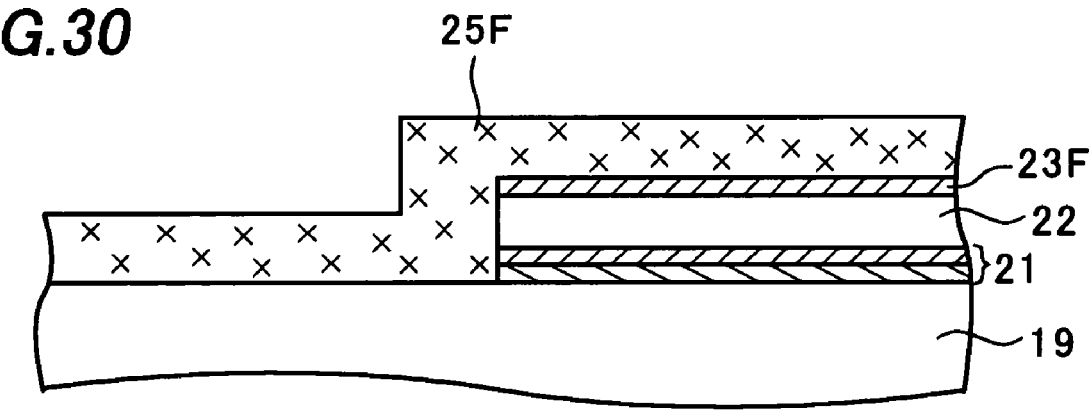

Next, a first passivation layer 25F is formed so as to cover the third barrier layer 21, the second wiring layer 22, and the antireflection layer 23F, as shown in FIG. 30. This first passivation layer 25F is made of a layer or a plurality of layers of the same material with the same thickness by the same deposition method as the passivation layer 25A of the first embodiment.

Figure 31:
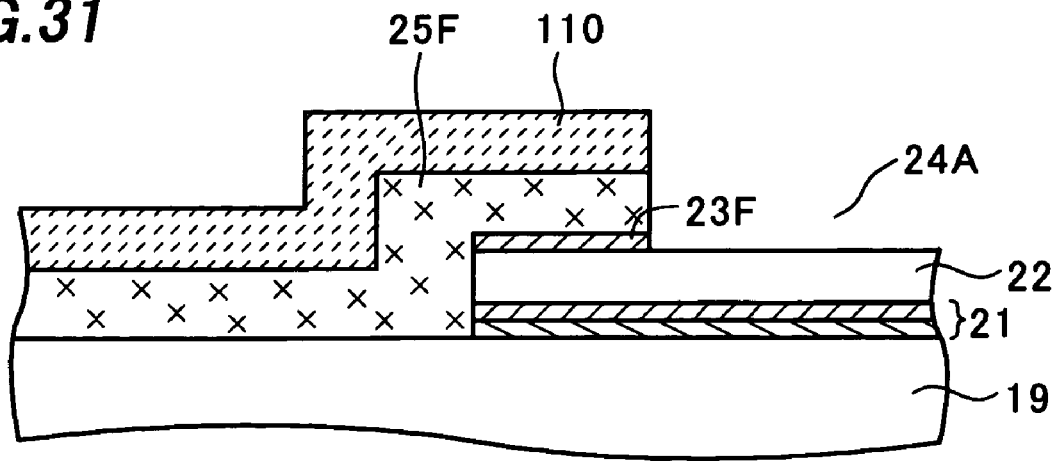

Next, as shown in FIG. 31, a tenth resist layer 110 is formed on the passivation layer 25F in a region corresponding to a portion of the third barrier layer 21 and a portion of the second wiring layer 22. Then, a portion of the passivation layer 25F and a portion of the antireflection layer 23F are removed by dry-etching with a gas containing fluorine (F), for example, a gas made of $CHF_3$ and $O_2$, a gas made of $CF_4$ and $O_2$, a gas made of $SF_6$, or the like using the tenth resist layer 110 as a mask. Thus, an opening 24A exposing a portion of the second wiring layer 22 is formed in the passivation layer 25F.

Figure 32:
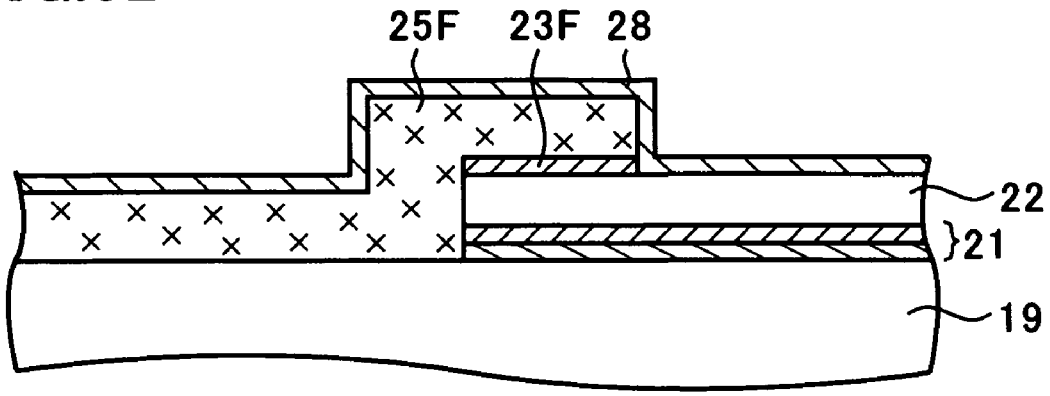

Furthermore, as shown in FIG. 32, a metal layer 28 is formed so as to cover the first passivation layer 25F and the inner surface of the opening 24A. This metal layer 28 is preferably made of aluminum (Al) with a thickness of, for example, about 10 to 1000 nm by a sputtering method.

Figure 33:
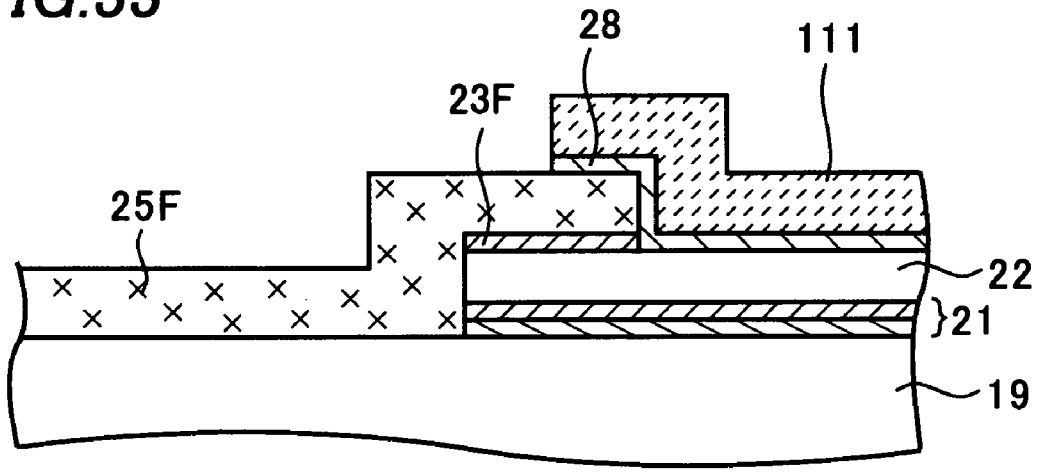
Figure 34:
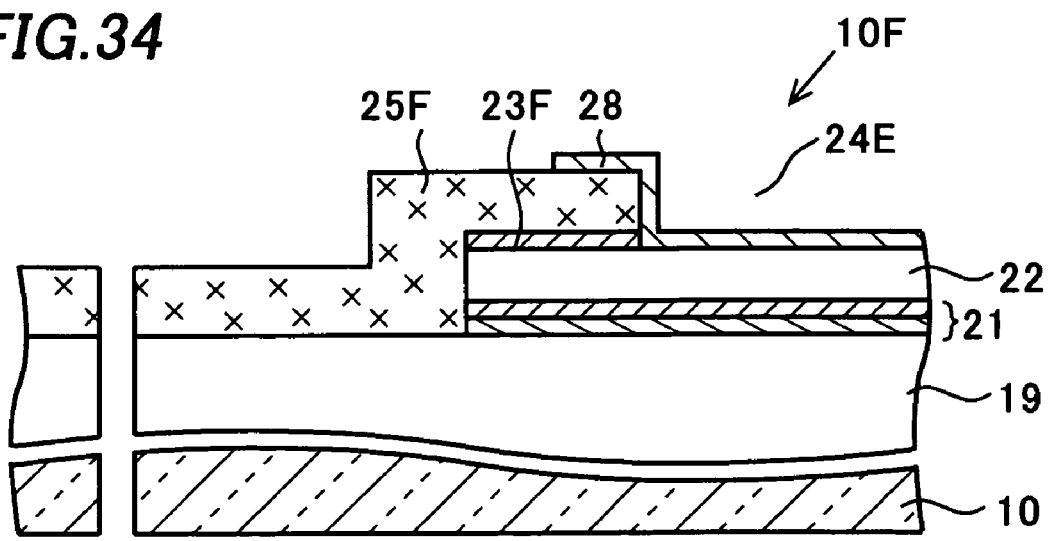
FIG. 34 is a cross-sectional view showing the semiconductor device and its manufacturing method of the sixth embodiment of the invention.

Next, as shown in FIG. 33, an eleventh resist layer 111 is formed on the metal layer 28 in a region corresponding to a portion of the third barrier layer 21, a portion of the second wiring layer 22, a portion of the remaining antireflection layer 23F, and a portion of the second wiring layer 22 where the antireflection layer 23F does not remain. Then, a portion of the metal layer 28 is removed by dry-etching with a gas containing fluorine (F), for example, a gas made of $CHF_3$ and $O_2$, a gas made of $CF_4$ and $O_2$, a gas made of $SF_6$, or the like using the eleventh resist layer 111 as a mask. After this etching, the eleventh resist layer 111 is removed.

Next, the semiconductor substrate 10 and the layers layered thereon are divided into a plurality of semiconductor dice 10F by dicing along a dicing line (not shown), as shown in FIG. 34.

As described above, the antireflection layer 23F and the second wiring layer 22 are covered with the metal layer 28 and not exposed in the opening 24E in this embodiment. Thus, moisture containing impurities, that is, moisture used in the manufacturing process (e.g. water for dicing containing $CO_2$ for preventing static electricity), moisture in the air, or the like does not reach the antireflection layer 23A, and this prevents cell reaction occurring between a titanium (Ti) component of the antireflection layer and an aluminum (Al) component of the second wiring layer 22 as has been seen in the conventional art. That is, aluminum that forms the second wiring layer 22 is prevented from being eluted. As a result, a connection failure when a wire is bonded to the second wiring layer 22 exposed in the opening 24E can be minimized, and the yield of the semiconductor device can be enhanced.

Next, a semiconductor device of the seventh embodiment of the invention will be described referring to figures. FIGS. 35 to 38 are cross-sectional views showing a method of manufacturing the semiconductor device of this embodiment. FIG. 39 is a cross-sectional view showing the semiconductor device and its manufacturing method of this embodiment.

The description of the semiconductor device of this embodiment will be made on the components formed above the second wiring layer 22 only in FIGS. 35 to 39, as in the first embodiment. The other components and the manufacturing method thereof are the same as those of the conventional art shown in FIG. 40. The components formed below the second interlayer insulation film 19 are omitted in the figures.

Figure 35:
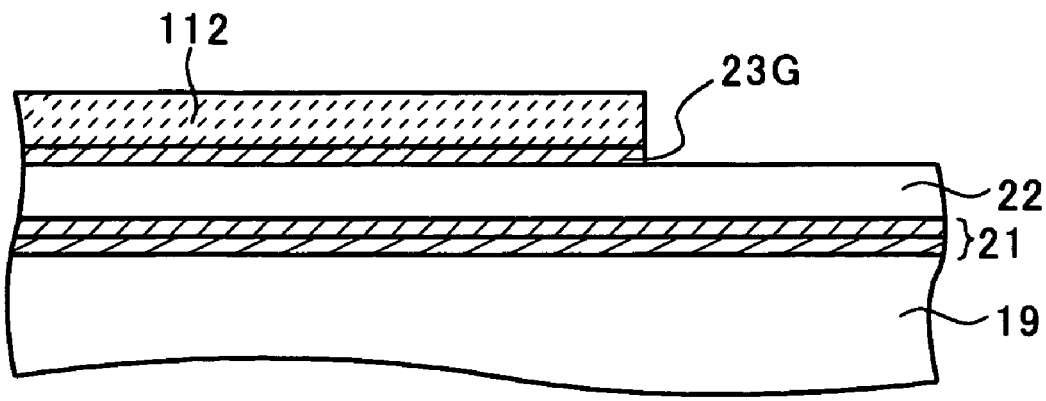
FIGS. 35 to 38 are cross-sectional views showing a method of manufacturing a semiconductor device of the seventh embodiment of the invention.

A twelfth resist layer 112 is formed on a portion of an antireflection layer 23G as shown in FIG. 35. Then, a portion of the antireflection layer 23G is dry-etched with a gas made of, for example, $CHF_3$ and $O_2$ using the twelfth resist layer 112 as a mask to expose a portion of the second wiring layer 22. The antireflection layer 23G is made of the same metal as the antireflection layer 23A of the first embodiment. After this etching, the twelfth resist layer 112 is removed.

Figure 36:
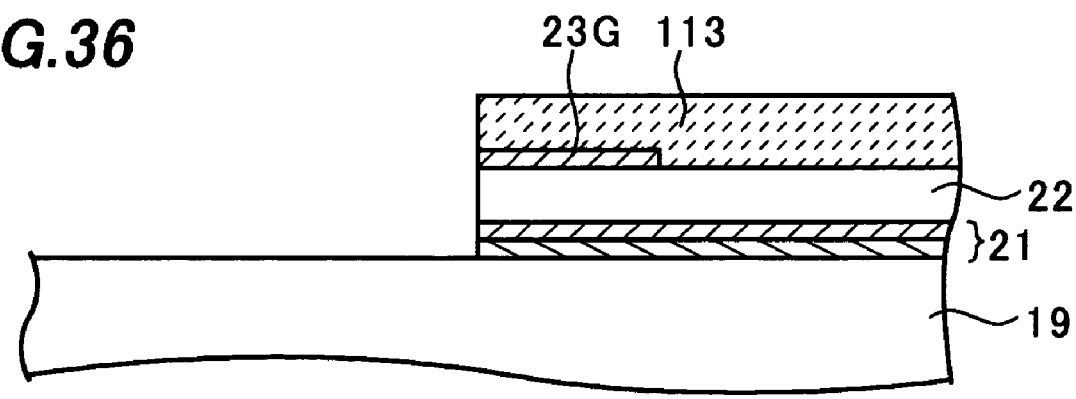

Next, as shown in FIG. 36, a thirteenth resist film 113 is formed on a portion of the second wiring layer 22 and a portion of the antireflection layer 23G. Then, a portion of the second wiring layer 22 and a portion of the antireflection layer 23G are dry-etched with a gas made of, for example, $CHF_3$ and $O_2$ using the thirteenth resist layer 113 as a mask, to be formed into a predetermined pattern. After this etching, the thirteenth resist layer 113 is removed.

Figure 37:
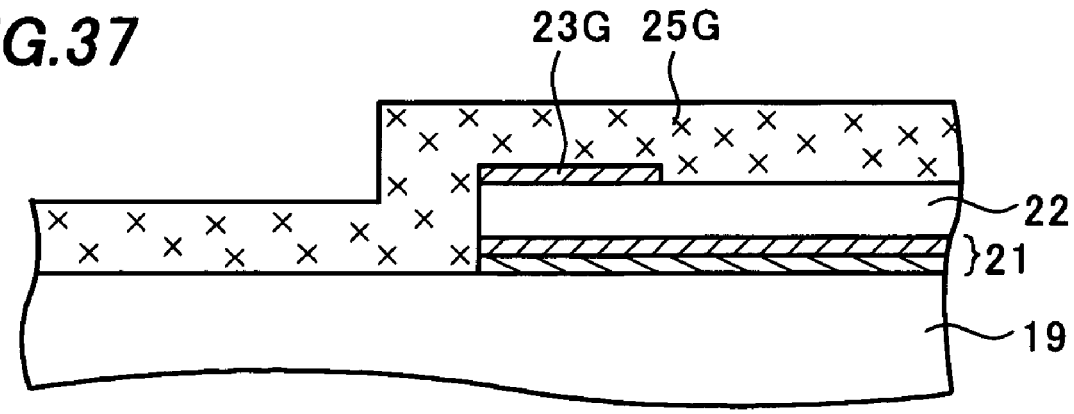

Next, a passivation layer 25G is formed so as to cover the third barrier layer 21, the second wiring layer 22, and the antireflection layer 23G, as shown in FIG. 37. This passivation layer 25G is made of a layer or a plurality of layers of the same material with the same thickness by the same deposition method as the passivation layer 25A of the first embodiment.

Figure 38:
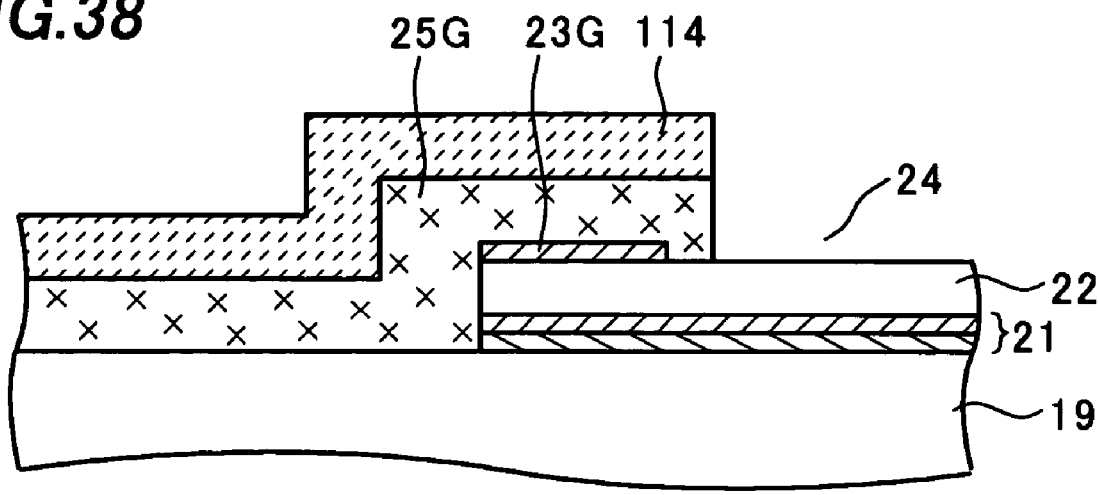
Figure 39:
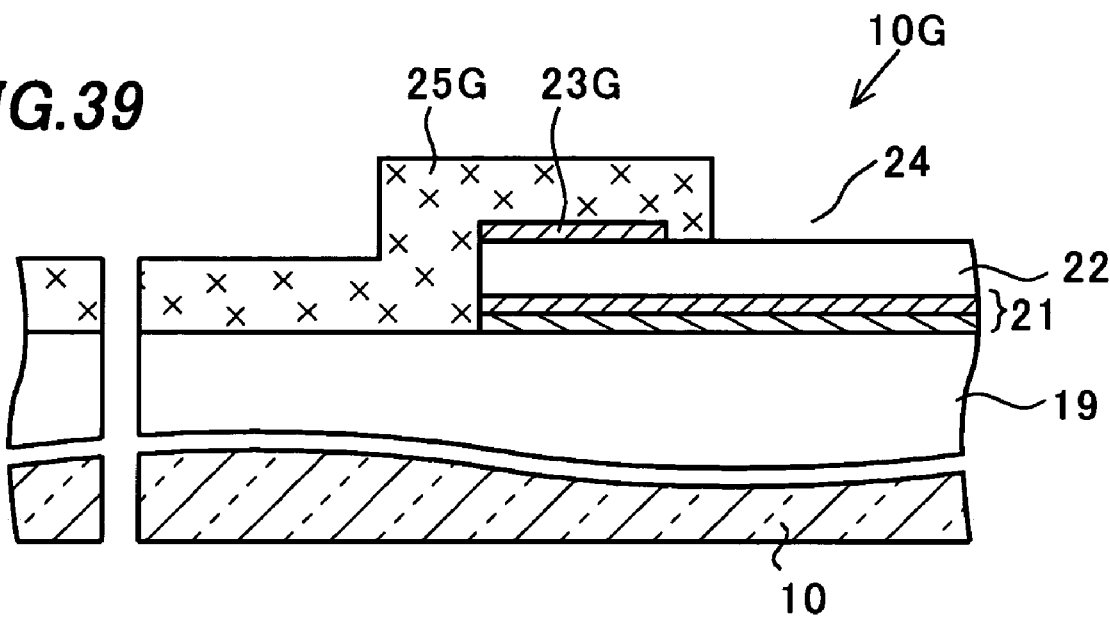
FIG. 39 is a cross-sectional view showing the semiconductor device and its manufacturing method of the seventh embodiment of the invention.

Next, as shown in FIG. 38, a fourteenth resist layer 114 is formed on the passivation layer 25G in a region corresponding to a portion of the third barrier layer 21, the remaining antireflection layer 23G and a portion of the second wiring layer 22 where the antireflection layer 23G does not remain. Then, a portion of the passivation layer 25G is removed by dry-etching with a gas containing fluorine (F), for example, a gas made of $CHF_3$ and $O_2$, a gas made of $CF_4$ and $O_2$, a gas made of $SF_6$, or the like using the fourteenth resist layer 114 as a mask.

Thus, an opening 24 exposing a portion of the second wiring layer 22 and not exposing an end portion of the antireflection layer 23G is formed in the passivation layer 25G. After this etching, the fourteenth resist layer 114 is removed.

Next, the semiconductor substrate 10 and the layers layered thereon are divided into a plurality of semiconductor dice 10G by dicing along a dicing line (not shown), as shown in FIG. 39.

As described above, the antireflection layer 23G is covered with the passivation layer 25G and not exposed in the opening 24 in this embodiment. Thus, moisture containing impurities, that is, moisture used in the manufacturing process (e.g. water for dicing containing $CO_2$ for preventing static electricity), moisture in the air, or the like does not reach the antireflection layer 23G, and this prevents cell reaction occurring between a titanium (Ti) component of the antireflection layer and an aluminum (Al) component of the second wiring layer 22 as has been seen in the conventional art. That is, aluminum that forms the second wiring layer 22 is prevented from being eluted. As a result, a connection failure when a wire is bonded to the second wiring layer 22 exposed in the opening 24 can be minimized, and the yield of the semiconductor device can be enhanced.

Although the second wiring layer 22 is the bonding pad and the structures of the layers formed below this layer 22 are the same as those of the conventional semiconductor device shown in FIG. 40 in the described first to seventh embodiments, the invention is not limited to this. That is, the invention can be applied to a semiconductor device having the other structure than above as long as the uppermost wiring layer is the bonding pad.

What is claimed is:

1. A semiconductor device comprising:
   a semiconductor die;
   a wiring layer disposed on the semiconductor die;
   a layer comprising titanium and disposed on a peripheral portion of a top surface of the wiring layer; and
   a passivation layer covering the wiring layer and the layer comprising titanium,
   wherein the passivation layer has an opening exposing a portion of the wiring layer and is in direct contact with a top surface of the wiring layer so that the layer comprising titanium is not exposed in the opening.

2. The semiconductor device of claim 1, wherein the wiring layer is made of aluminum or an aluminum alloy.

3. The semiconductor device of claim 1, wherein the passivation layer comprises an inorganic film.

4. The semiconductor device of claim 1, wherein the passivation layer comprises a plurality of inorganic films.

5. The semiconductor device of claim 1, further comprising a bonding wire connected to the exposed portion of the wiring layer.

* * * * *